(12) United States Patent
Zhang et al.

(10) Patent No.: US 9,018,092 B2
(45) Date of Patent: Apr. 28, 2015

(54) ENCAPSULATED METAL INTERCONNECT

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 42 days.

(21) Appl. No.: 13/629,402

(22) Filed: Sep. 27, 2012

(65) Prior Publication Data

US 2014/0084465 A1    Mar. 27, 2014

(51) Int. Cl.
*H01L 21/4763* (2006.01)
*H01L 21/44* (2006.01)
*H01L 21/768* (2006.01)

(52) U.S. Cl.
CPC .... *H01L 21/76816* (2013.01); *H01L 21/76831* (2013.01); *H01L 21/76834* (2013.01); *H01L 21/76838* (2013.01)

(58) Field of Classification Search
USPC ......... 438/650, 686, 637, 618, 622, 623, 627, 438/629, 639, 687
See application file for complete search history.

(56) References Cited

U.S. PATENT DOCUMENTS

| | | | |
|---|---|---|---|
| 7,115,465 B2 * | 10/2006 | Marty et al. | 438/234 |
| 2011/0133255 A1 * | 6/2011 | Merz | 257/253 |
| 2012/0313153 A1 * | 12/2012 | Zhang et al. | 257/288 |

* cited by examiner

*Primary Examiner* — A. Sefer
*Assistant Examiner* — Dilinh Nguyen
(74) *Attorney, Agent, or Firm* — Seed IP Law Group

(57) ABSTRACT

A plurality of metal tracks are formed in an integrated circuit die in three metal layers stacked within the die. A protective dielectric layer is formed around metal tracks of an intermediate metal layer. The protective dielectric layer acts as a hard mask to define contact vias between metal tracks in the metal layers above and below the intermediate metal layer.

13 Claims, 16 Drawing Sheets

ENCAPSULATED METAL INTERCONNECT

BACKGROUND

1. Technical Field

The present disclosure relates to the field of integrated circuit design. The present disclosure relates more particularly to metal interconnections within an integrated circuit die.

2. Description of the Related Art

As integrated circuit technology continues to scale down to smaller technology nodes, the back end of the line connections become very challenging and complicated to implement. Complex patterning schemes such as double patterning are used to provide smaller and smaller interconnection features. Many problems can occur within the integrated circuits as vias and metal lines within the become smaller and closer together. These problems can include difficulty in alignment of photolithography masks during manufacture, as well as electromigration and time dependent dielectric breakdown during the life of the integrated circuit.

BRIEF SUMMARY

One embodiment is a method for forming metal interconnections in an integrated circuit die. First metal tracks are formed from a first metal layer on a substrate of an integrated circuit die. A first dielectric layer is formed on the substrate and the first metal layer. Second metal tracks are formed on the first dielectric layer and are each encapsulated in a protective dielectric covering. A second dielectric layer is formed on the first dielectric layer and on the protective covering. The first and second dielectric layers are selectively etchable with respect to the protective dielectric covering.

The second dielectric layer is then patterned and etched to form contact vias through the second and third dielectric layers to the first metal tracks. The patterned features of the mask used to open vias in first and second dielectric layers are comparatively large because the protective covering on the second metal tracks acts as a mask to form the vias because the protective covering is not etched by the etchant that opens the vias. Thus while a large opening may be made in the second dielectric layer above the second metal tracks, the vias are formed only on the sides of the second metal tracks and are small in spite of the comparatively large features of the photolithography mask. In this manner vias are formed through the first and second dielectric layers to the first metal tracks.

A conductive material is then deposited in the vias and over the second dielectric layer and protective layer. The conductive material is then removed over the second dielectric layer leaving patterned third metal tracks integral with the conductive plugs of the filled vias.

DETAILED DESCRIPTION

Figure 1:
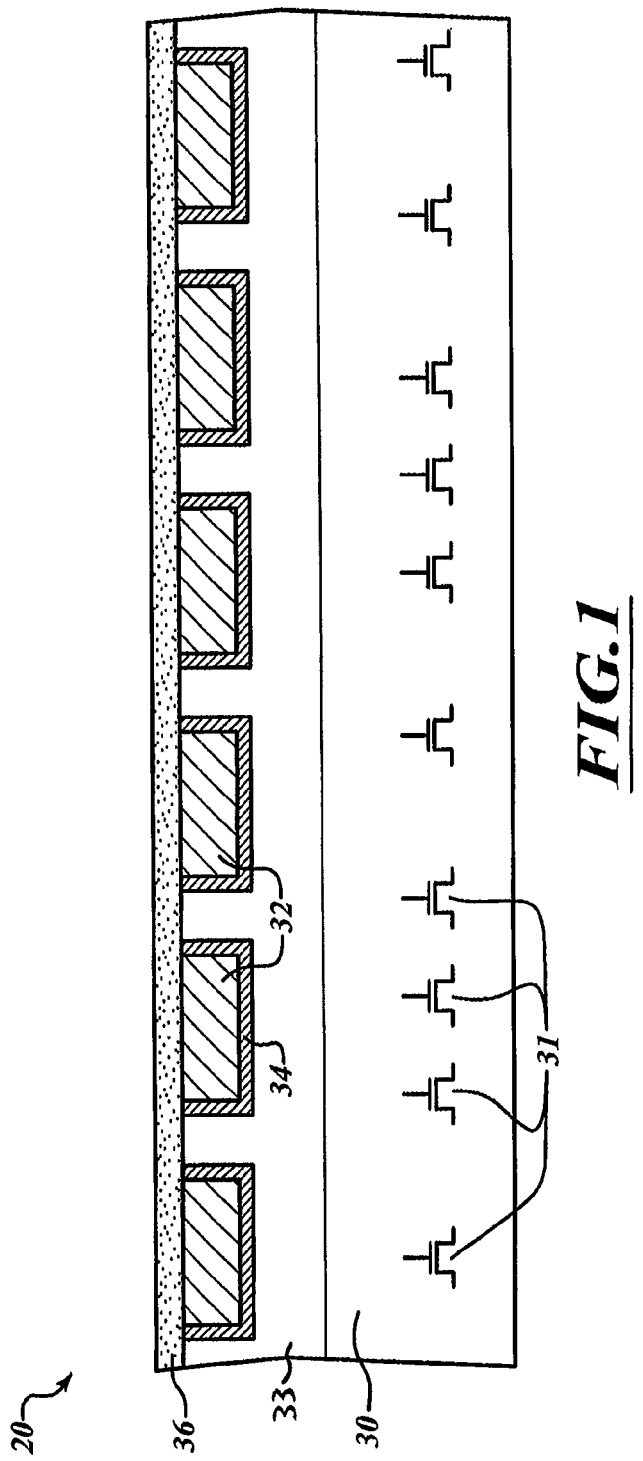
FIG. 1 is a cross section of an integrated circuit die having metal tracks formed from a first metal layer on a dielectric layer according to principles disclosed herein.

FIG. 1 is a cross section of an integrated circuit die 20 including a semiconductor substrate 30 and a dielectric layer 33. Transistors 31 are formed in the substrate 30. Metal tracks 32 are formed on the substrate 30. Each metal track 32 is lined by a thin barrier layer 34. The metal tracks 32 and the dielectric layer 33 are covered in a dielectric capping layer 36.

The dielectric layer 33 is shown as a single layer in FIG. 1, however in practice the dielectric layer 33 can include conductive and dielectric layers set on top of the semiconductor substrate 30 in which transistors 31 are formed. Though not illustrated, additional metal tracks, vias, and signal lines may be formed in the dielectric layer 33 below the metal tracks 32. The metal tracks 32 are conductive signal carrying lines which allow signals to be passed through the integrated circuit die 20, including to the transistors 31 and to metal contacts outside the integrated circuit die 20, such as contact pads, solder balls, or leads. In the integrated circuit die 20 as illustrated in FIG. 1, there may be many components not illustrated which are below the first metal tracks 32 of the first metal layer. While the tracks 32 are described as being formed in the first metal layer, it is understood that there may be more metal layers below the first metal layer. The metal tracks 32 allow connection between transistors 31 formed in the semiconductor substrate and with components outside the integrated circuit die 20.

In one embodiment the substrate 30 includes silicon dioxide layers, low k dielectric layers, silicon nitride layers, or other suitable dielectric layers on the semiconductor substrate 30. The semiconductor substrate 30 is for example silicon or another suitable semiconductor layer in and on which transistors 31 can be formed.

In one example the metal tracks 32 are formed of copper. The barrier layer 34 is one or more layers of titanium, titanium nitride, tantalum, tantalum nitride or other suitable barrier layers. The metal tracks 32 are, for example, 60-100 nm in thickness. The metal tracks 32 are separated by 32 nm, 20 nm, or any suitable distance depending on the technology node and minimum dimensions being implemented. In many integrated circuits the metal tracks are formed of aluminum or aluminum copper due to difficulties in processing copper lines and vias. However, as the technology nodes decrease to smaller and smaller dimensions, copper is preferred for metal tracks and vias in integrated circuit dies due to high conductivity and other parameters. Any suitable metal may be used for the metal tracks, vias, and barrier layers.

The capping layer 36 is, for example, silicon nitride or preferably a silicon nitride layer including carbon. The capping layer 36 and is between 200-500 Å thick. Other suitable materials and dimensions may be used for the features described in FIG. 1.

Figure 2:
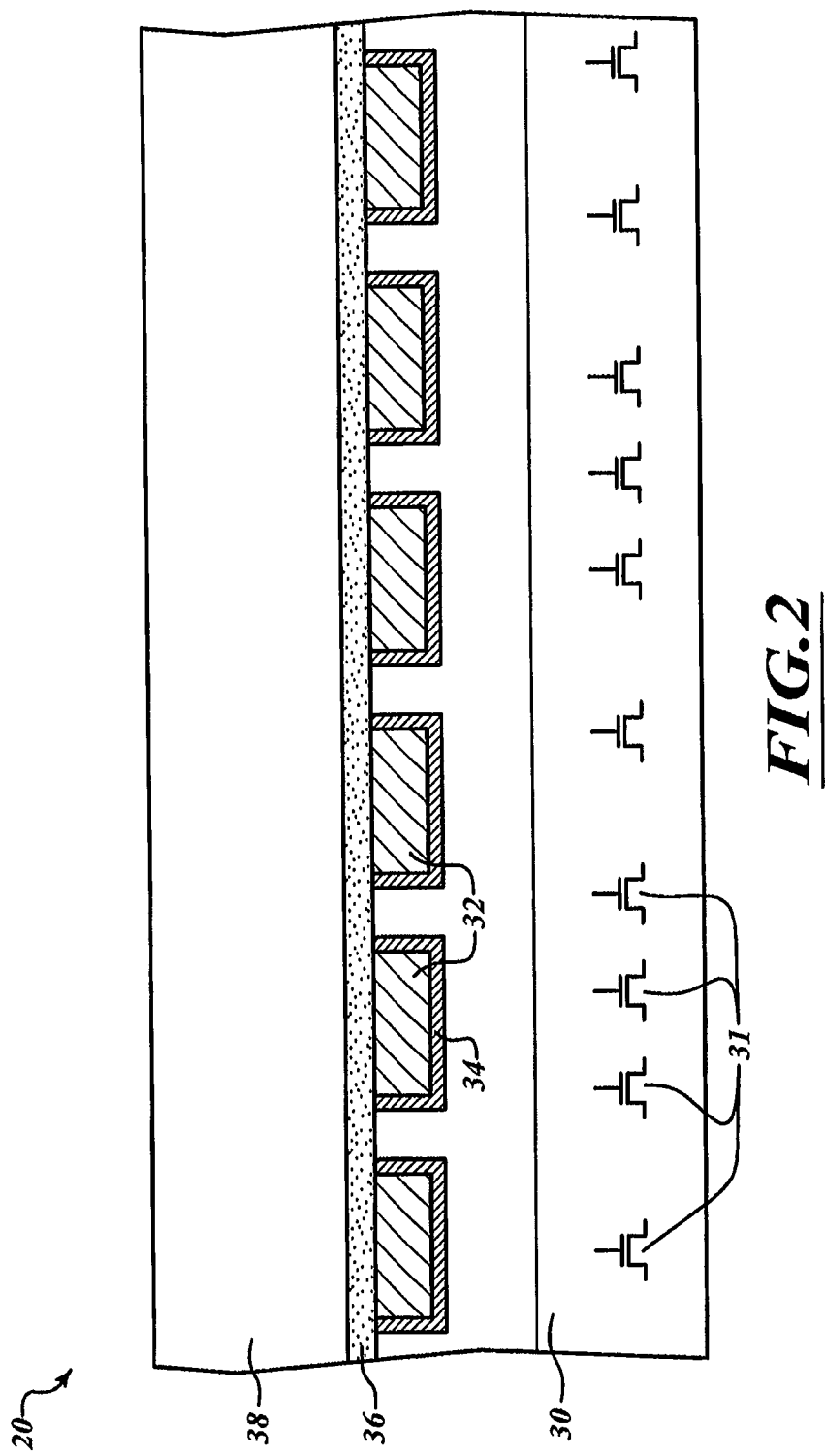
FIG. 2 is a cross section of an integrated circuit die in which a second dielectric layer has been formed over the first metal layer.

In FIG. 2, a first intermetal dielectric layer 38 has been deposited on the capping layer 36. The first intermetal dielectric layer 38 is, for example, a nanoporous dielectric layer between 600-1500 Å in thickness. As dimensions in the features of integrated circuits continue to shrink, the capacitance between conductive features of the integrated circuits begins to increase. For example, the capacitance between metal tracks formed in an integrated circuit die 20 or between metal tracks and vias formed in an integrated circuit die 20 increases as the distance between the features decreases. The capacitance between the conductive features of the integrated circuit is also proportional to the dielectric constant of the material between them. For this reason, the first intermetal dielectric layer 38 is a low K dielectric layer. This means that the dielectric constant of the intermetal dielectric layer 38 is comparatively small. This helps to reduce the capacitance between features formed in or on or under the first intermetal dielectric layer 38. The intermetal dielectric layer 38 can be, for example, a porous dielectric, such as porous silicon dioxide or other porous material. Alternatively, the first intermetal dielectric layer 38 can be a material other than a porous dielectric layer, but still formed of a material having a very low dielectric constant.

Figure 3:
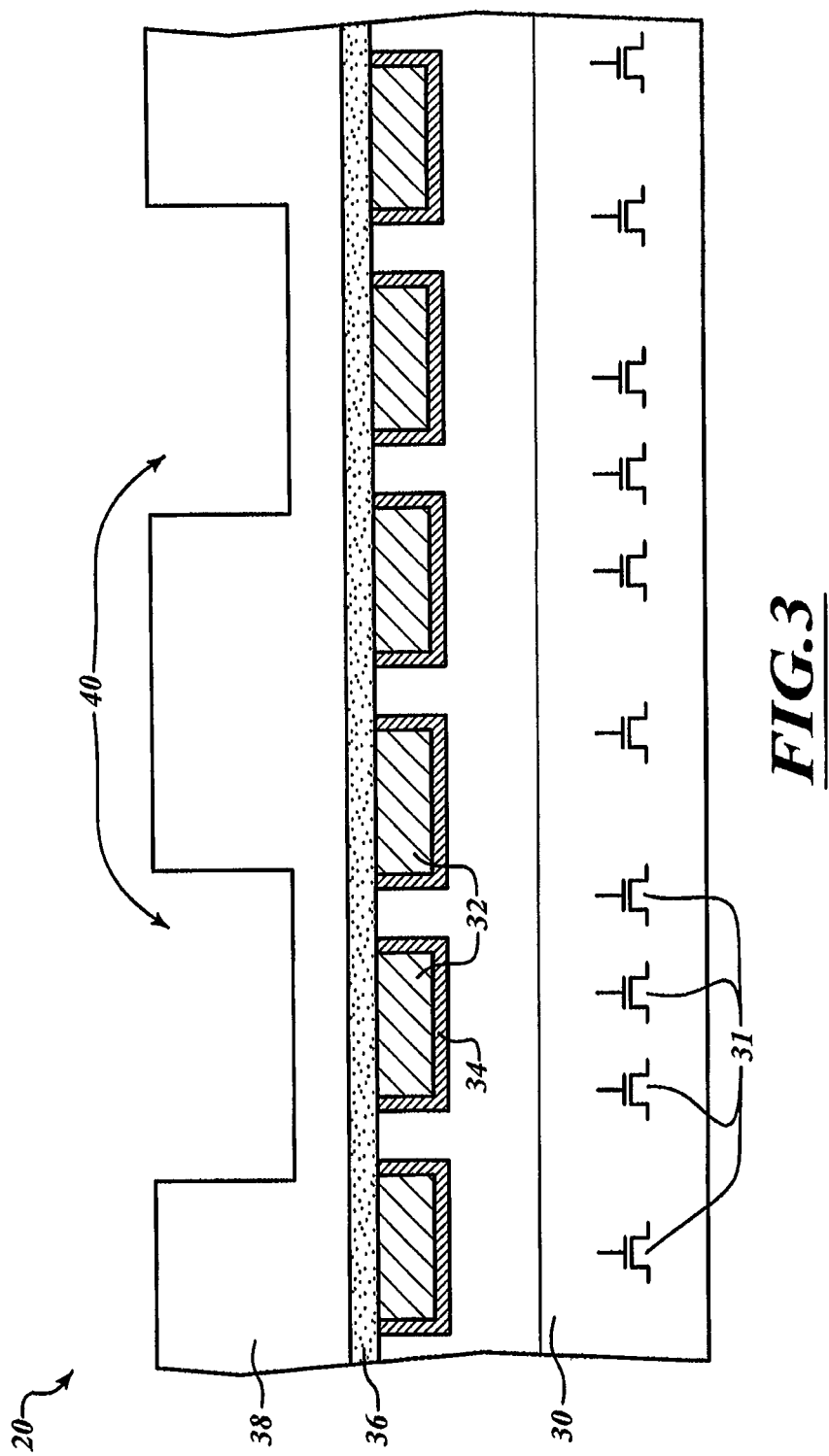
FIG. 3 is a cross section of an integrated circuit die having openings formed in the second dielectric layer.

In FIG. 3, the first intermetal dielectric layer 38 is patterned and etched to open trenches 40 in the first intermetal dielectric layer 38. The first intermetal dielectric layer 38 is not etched all the way to the capping layer 36. Instead, the intermetal dielectric layer 38 is etched using a time-based control to selectively etch to a certain depth. The depth of the trenches 40 in FIG. 3 is, for example, 600 Å. The trenches 40 in the first intermetal dielectric layer 38 can be opened by using a reactive ion etch. The time-based control which controls the depth of the reactive ion etch is, for example, a step height advanced process control. Such an advanced process control allows the etch to go to a particular depth without going further. The trenches 40 in FIG. 3 are, for example, 64 nm in width. Many other suitable dimensions for the trenches 40 can be selected according to the desired parameters of the integrated circuit die 20. Furthermore, etching techniques other than those described can be used to achieve the same or similar results, as desired.

Figure 4:
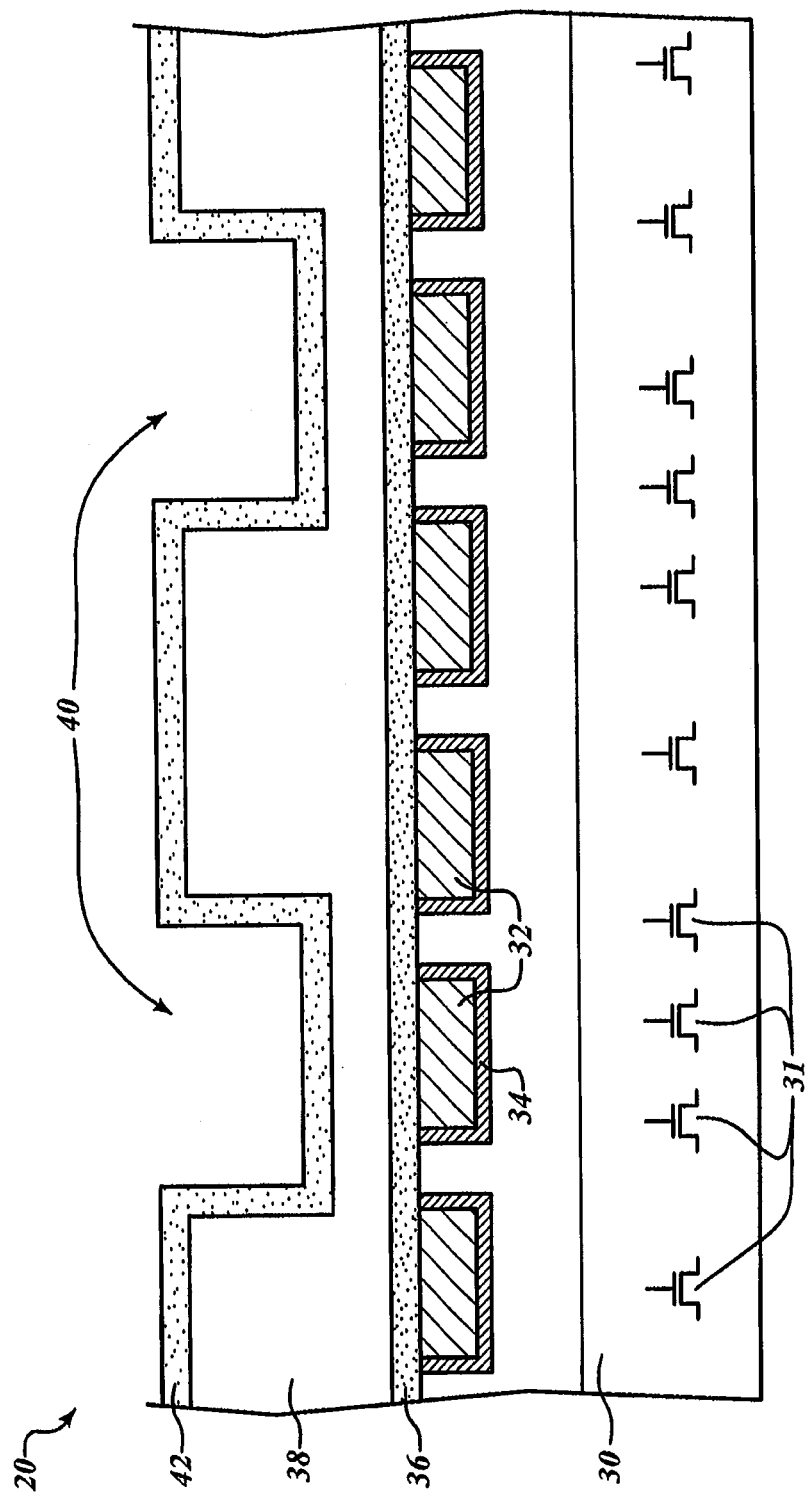
FIG. 4 is a cross section of an integrated circuit die having a protective dielectric layer in the opening in the second dielectric layer.

In FIG. 4, a protective dielectric layer 42 is deposited on the first intermetal dielectric layer 38 and in the trenches 40. The protective dielectric layer 42 has a high etch selectivity with respect to the first intermetal dielectric layer 38. The protective dielectric layer 42 also has as low of a K value as possible while retaining high etch selectivity with respect to the first intermetal dielectric layer 38. The protective dielectric layer 42 is, for example, 300-500 Å thick. In one embodiment, the protective dielectric layer 42 is the same material as the layer 36, for example silicon nitride or preferably a silicon nitride film including carbon. Carbon in the silicon nitride film increases robustness of the film while also improving etch electivity with respect to the first intermetal dielectric layer 38. The protective dielectric layer 42 can be deposited by chemical vapor deposition processes such as plasma enhanced chemical vapor deposition or low pressure chemical vapor deposition. The layer 42 is of a higher density than 38 in the preferred embodiment, and a high density chemical vapor deposition process can be used. Alternatively the protective dielectric layer 42 can be formed using other suitable methods or processes.

Figure 5:
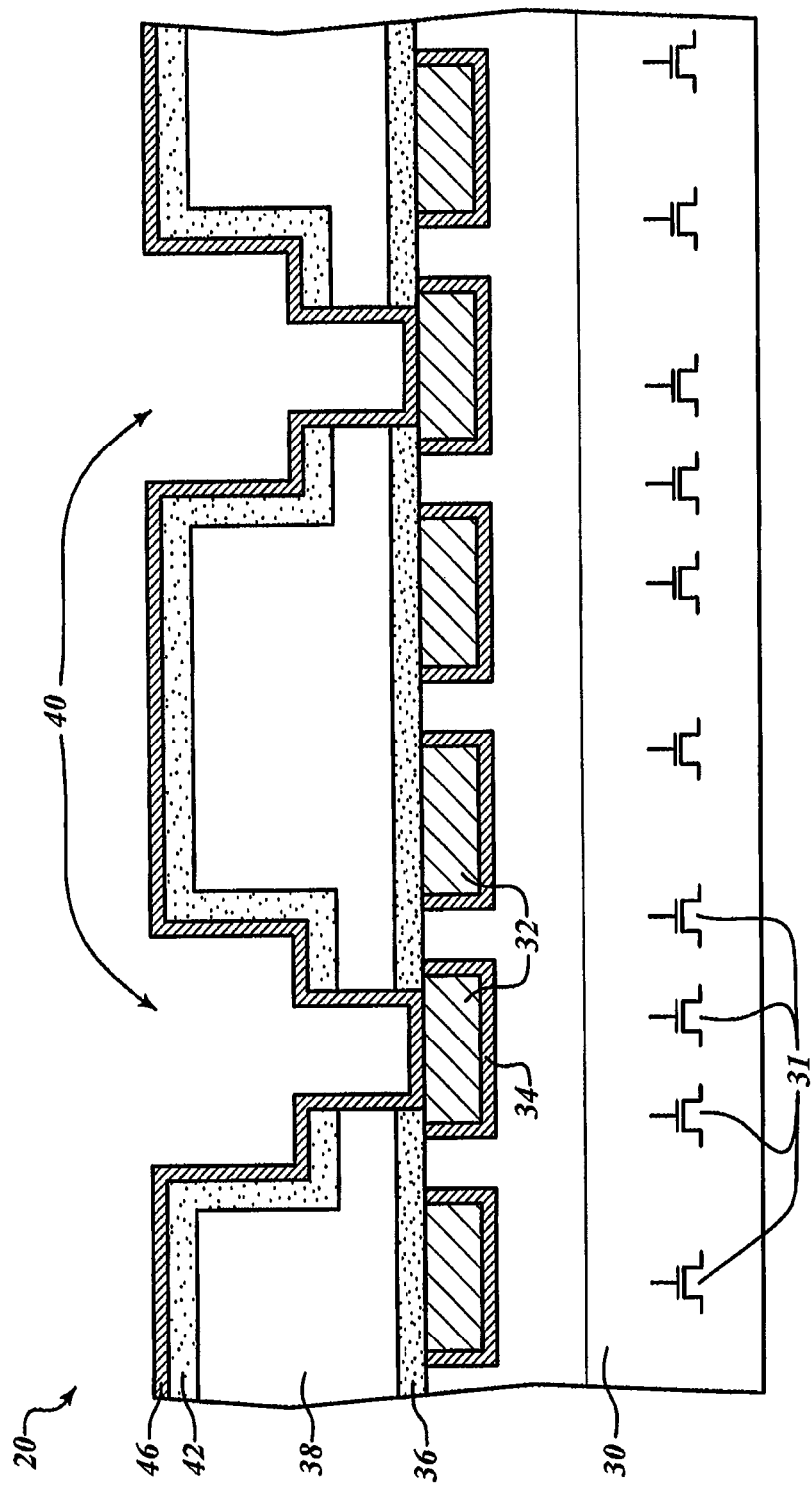
FIG. 5 is a cross section of an integrated circuit die having a metal barrier layer formed on the protective dielectric layer in the opening of the second dielectric layer.

In FIG. 5, the protective dielectric layer 42 is patterned and etched so that vias may be formed connecting to selected ones of the first metal tracks 32. After the protective dielectric layer 42 is opened, the first intermetal dielectric layer 38 is etched below the openings in the protective dielectric layer 42 to form the vias connecting to the first metal tracks 32.

In one example the openings to the first metal tracks 32 are formed by using an optical planarization layer as the mask layer. Other suitable lithography or photolithography techniques can be employed to form the openings 40 including the vias connecting to the first metal tracks 32.

After the vias have been formed, a thin barrier layer 46 is deposited on the protective dielectric layer 42 and in the trenches 40 and contacting the exposed first metal tracks 32. The barrier layer 46 is, for example, one or more layers of titanium, titanium nitride, tantalum, or tantalum nitride. Alternatively other suitable materials used to form the barrier layer 46. The barrier layer 46 also acts as an adhesive layer for a subsequently deposited metal layer. The barrier layer 46 is, for example, 80 Å thick.

In an alternative embodiment, the protective dielectric layer 42 is deposited in the trench 40 on the sidewalls and on the exposed portions of the first metal tracks 32. The protective dielectric layer 42 is then removed from the exposed portions of the first metal lines 32. The barrier layer 46 is then formed on top of the protective dielectric layer 42. In this manner the first intermetal dielectric layer 38 is separated from the barrier layer 46.

Figure 6:
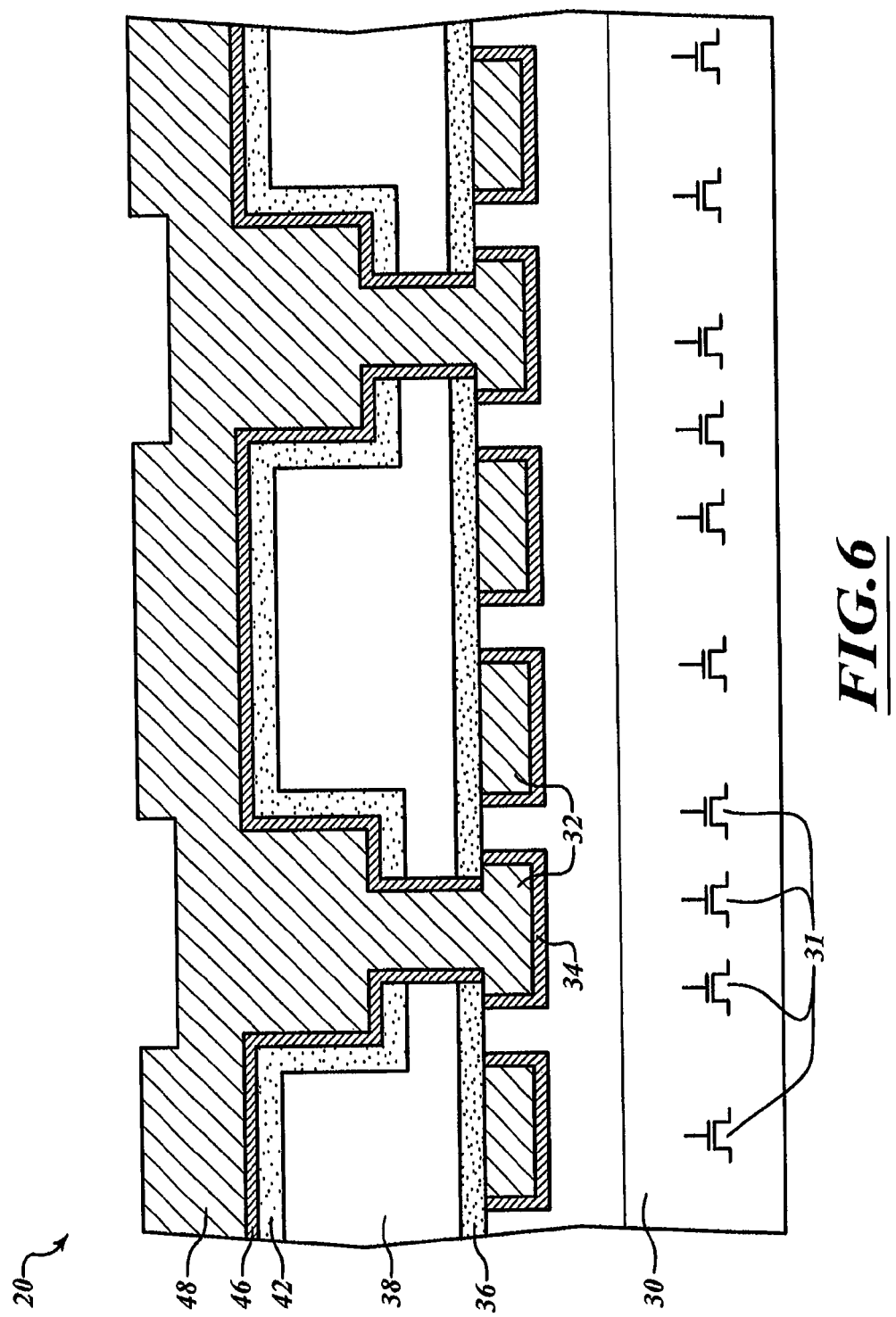
FIG. 6 is a cross section of an integrated circuit die having a second metal layer filling the opening in the second dielectric layer.

In FIG. 6, a thick layer of conductive layer 48 is deposited on the barrier layer 46 and in the trenches 40. The conductive layer 48 fills the trenches 40 and extends above the surface the upper surface of the first intermetal dielectric layer 38. The conductive material 48 is in direct contact with the barrier layer 46 and the exposed portion of the first metal tracks 32.

The conductive material 48 is for example the same material as the first metal tracks 32, preferably copper. However, other suitable materials can be used for the conductive material 48. The conductive material can be formed using an electroplating process. In particular, the conductive material 48 can be deposited by a combination of electroless and electroplating processes. Other suitable processes can be used to form the conductive material 48.

Figure 7:
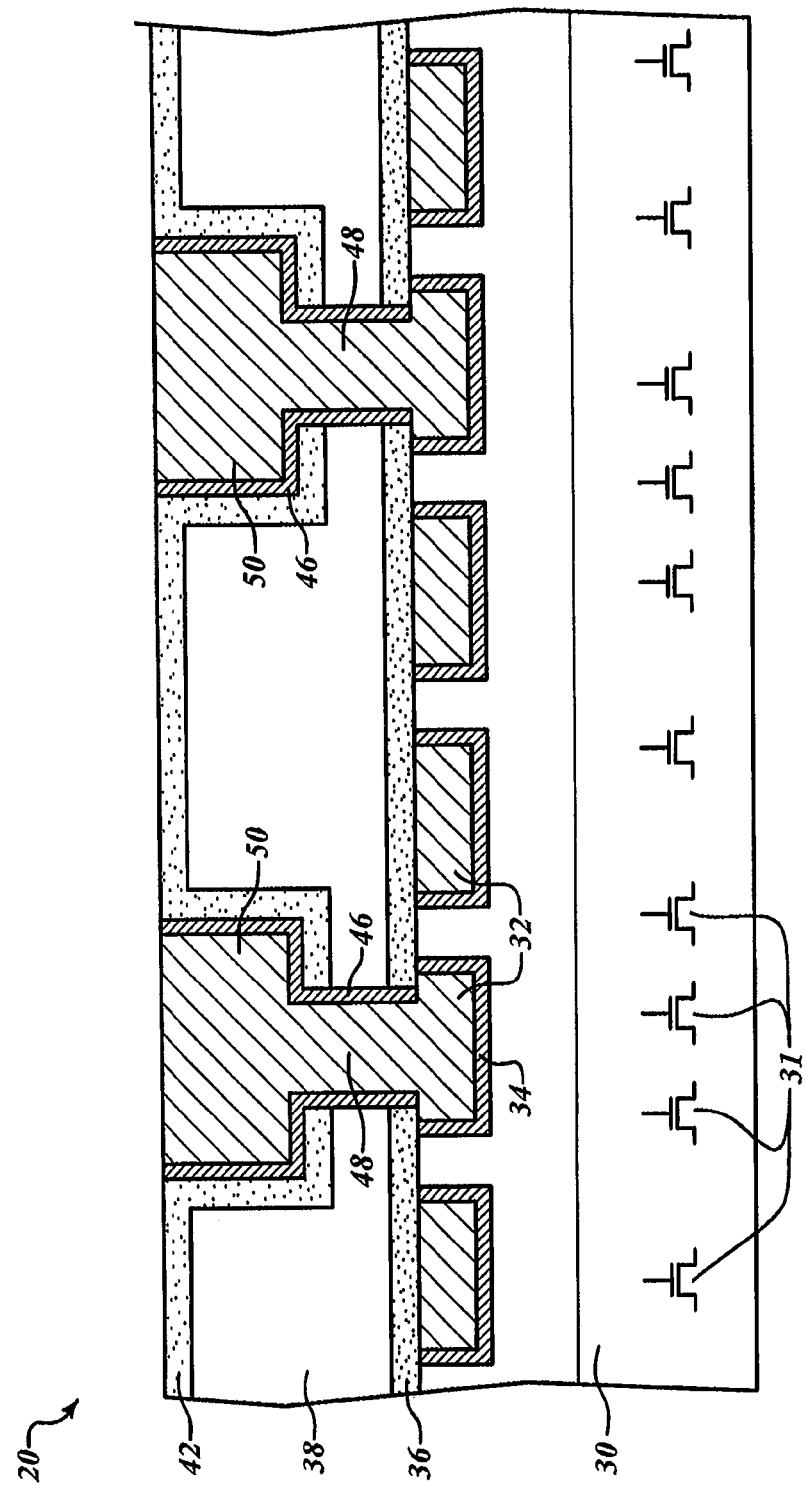
FIG. 7 is a cross section of an integrated circuit die after the second metal layer has been planarized to define second metal tracks of the second metal layer.

In FIG. 7, a planarization step has been performed to remove excess conductive material from the protective dielectric layer 42. The planarization step is, for example, a chemical mechanical planarization step configured to stop on the protective dielectric layer 42. This has the effect of removing excess conductive material while forming discrete second metal tracks 50. The second metal tracks 50 are connected to the first metal tracks 32 by vias 49 formed previously. The conductive material 48 forms both the plugs for the vias 49 and the second metal tracks 50. The second metal tracks 50 are thus formed in the metal 2 layer. The second metal tracks 50 are covered on the sides and bottom by the protective dielectric layer 42. The second metal tracks 50 are only uncovered on those portions of the bottom through which contact will be made to the first metal tracks 32.

Figure 8:
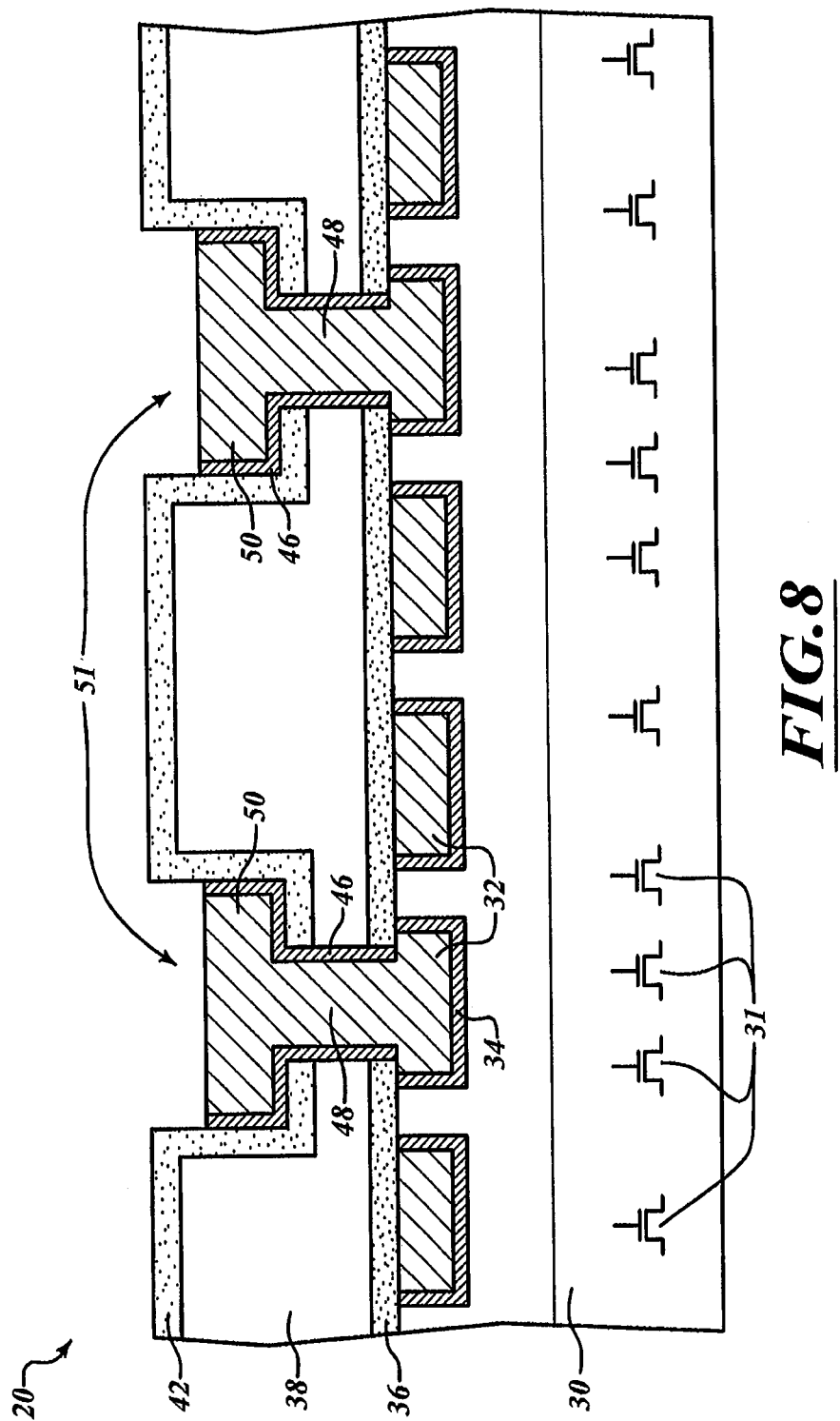
FIG. 8 is a cross section of an integrated circuit die after the second metal tracks have been reduced in thickness.

In FIG. 8, a portion of the second metal tracks 50 is removed. In one example, between 15 and 35 nm in thickness of the second metal tracks 50 is removed. The removal of the top material of the second metal tracks 50 can be done, for example, by a chemical mechanical planarization step which etches the second metal track 50 faster than the protective dielectric layer 42. Alternatively, a reactive ion etch can be performed which also etches the copper faster than the protective dielectric layer 42. In this way, the material from the second metal tracks 50 can be removed selectively with respect to the protective dielectric layer 42 without using a mask. In other words, whether done by CMP or reactive ion etching, no mask is used and because the etching process etches the second metal tracks 50 much more quickly than it does the protective dielectric layer 42 the structure shown in FIG. 8 remains after the etch process. This leaves trenches 51 formed above the metal tracks 50.

Figure 9:
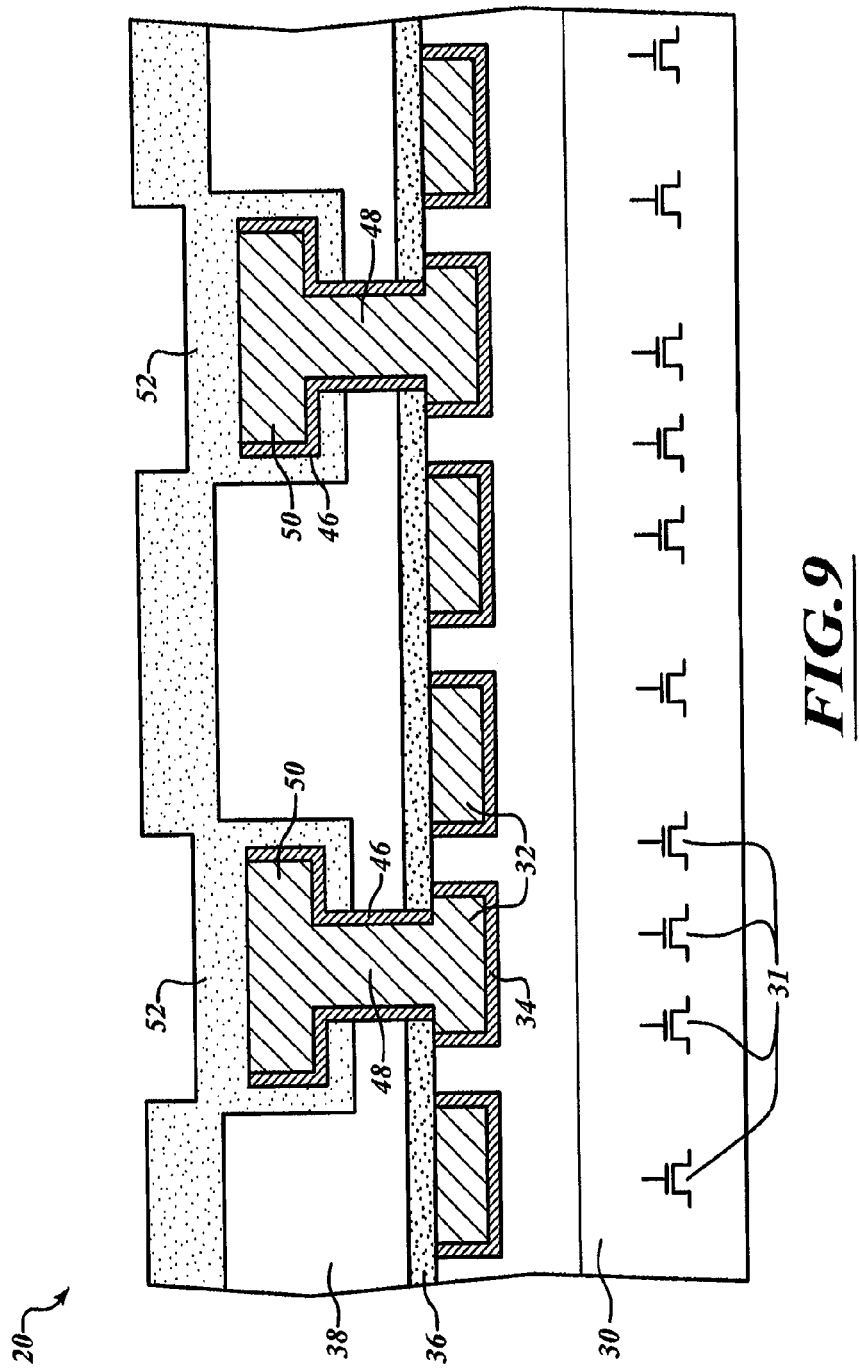
FIG. 9 is a cross section of an integrated circuit die having a protective dielectric layer overlying the second dielectric layer and the second metal tracks.

In FIG. 9, a protective dielectric layer 52 is deposited on top of the metal tracks 50 and in the trenches 51 and on top of the protective dielectric layer 42. The protective dielectric material 52 is preferably the same material protective dielectric layer 42, but could be different or an additional layer. While the second metal tracks 50 are shown as being larger than the first metal tracks 32, alternatively the second metal tracks 50 can be the same size or smaller than the first metal tracks 32.

Figure 10:
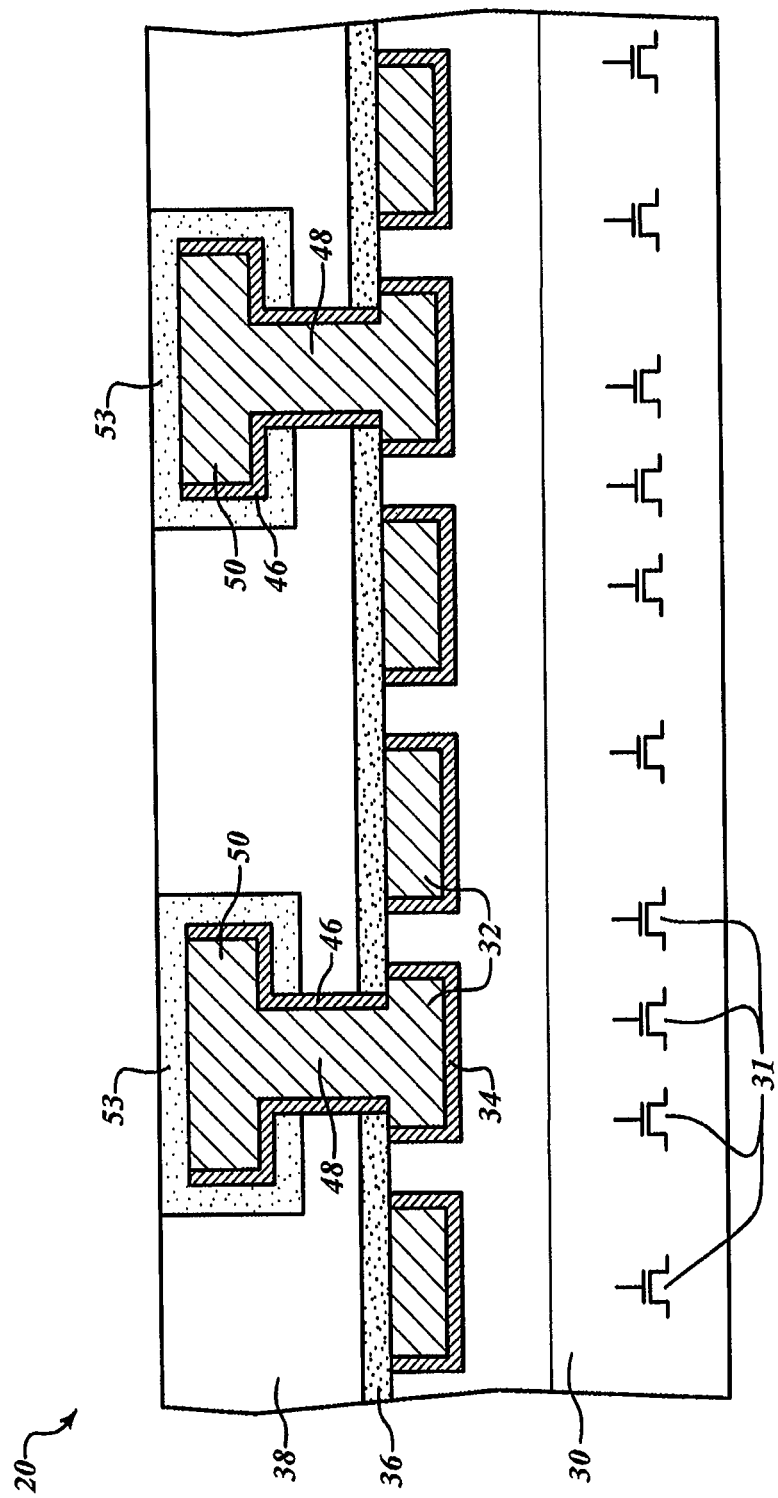
FIG. 10 is a cross section of an integrated circuit die having the second dielectric layer and the protective dielectric layer planarized.

In FIG. 10, a planarization process is performed to remove excess protective dielectric material from on top of the first intermetal dielectric layer 38. One example of the planarization process is a chemical mechanical planarization process configured to stop at the first intermetal dielectric layer 38. This leaves second metal lines 50 that are encapsulated with a dielectric encapsulation layer 53. As described previously, the first intermetal dielectric layer 38 is selectively etchable with respect to the dielectric encapsulation layer 53 encapsulating the second metal tracks 50.

Having metal tracks 50 encapsulated in a dielectric encapsulation layer 53 helps to avoid some of the problems which come with further downscaling of the dimensions of metal lines, dielectric layers, and vias. For example, in a metal line encapsulated only by a low K dielectric layer or even a common dielectric layer, the problem of electromigration of metal atoms from the metal tracks into the dielectric material occurs. This can cause serious problems in the integrated circuit. For example, if the metal track is made of copper and copper atoms migrate into a porous low K dielectric, not only does the quality of the metal track decrease, but copper atoms can migrate from the metal tracks through the porous dielectric material into sensitive areas. The dielectric encapsulation layer 53 helps to prevent this problem.

Another problem that can occur with downscaling of components of the integrated circuit die 20 is time-dependent dielectric breakdown. As currents are carried through the metal tracks damage can occur to dielectric material surrounding the metal tracks. This is especially true for low K dielectric materials that are used as inter level dielectric layers as described previously.

Encapsulating the metal track in a high density insulating dielectric encapsulation layer 53 protects the integrated circuit die 20 from time-dependent dielectric breakdown. The metal lines encapsulated in the dielectric encapsulation layer 53 can also carry higher voltages. This allows for an increased usage range of the integrated circuit die 20. Such an integrated circuit die 20 can be used in both low voltage and high voltage applications.

The dielectric encapsulation layer 53 is a relatively thin layer about 200-500 Å thick. Because the dielectric encapsulation layer 53 is both thin and robust, a thicker low K dielectric material can fill the space between metal tracks 50 thereby providing the low capacitance benefits of a low K dielectric material while providing robust insulation against time dependent dielectric breakdown and electromigration.

Figure 11:
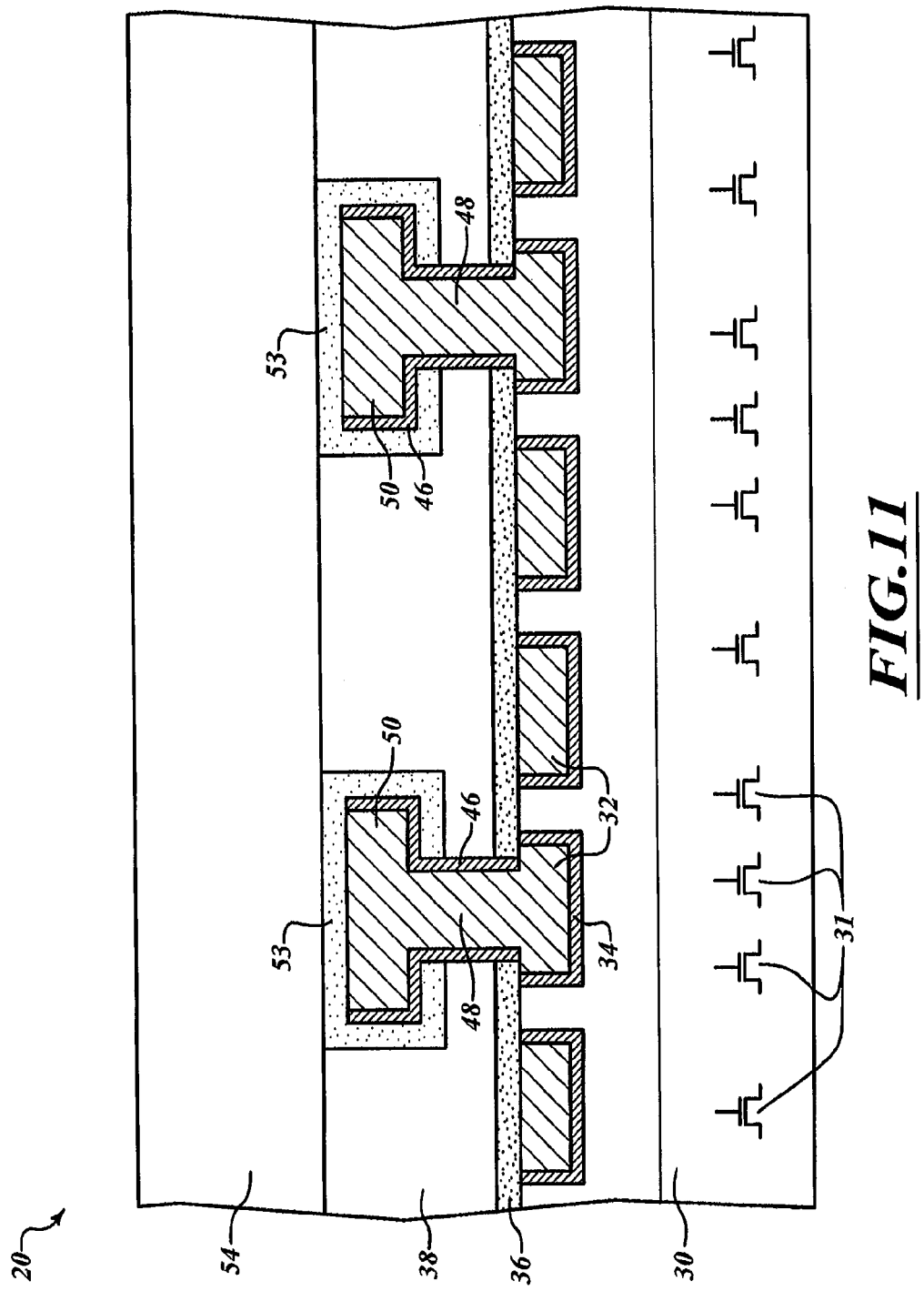
FIG. 11 is a cross section of an integrated circuit die having a third dielectric layer overlying the second dielectric layer and the second metal tracks.

In FIG. 11, a second intermetal dielectric layer 54 has been deposited on the first intermetal dielectric layer 38 and on the insulating material 52. The second intermetal dielectric layer 54 is also a low K dielectric layer or other suitable dielectric layer. The second intermetal dielectric layer is selectively etchable with respect to the dielectric encapsulation layer 53. The second intermetal dielectric layer can include multiple layers, such as silicon oxide layers, porous dielectric layers, or other suitable dielectric layers. The intermetal dielectric layer 54 is, for example, 1000 Å thick.

Figure 12:
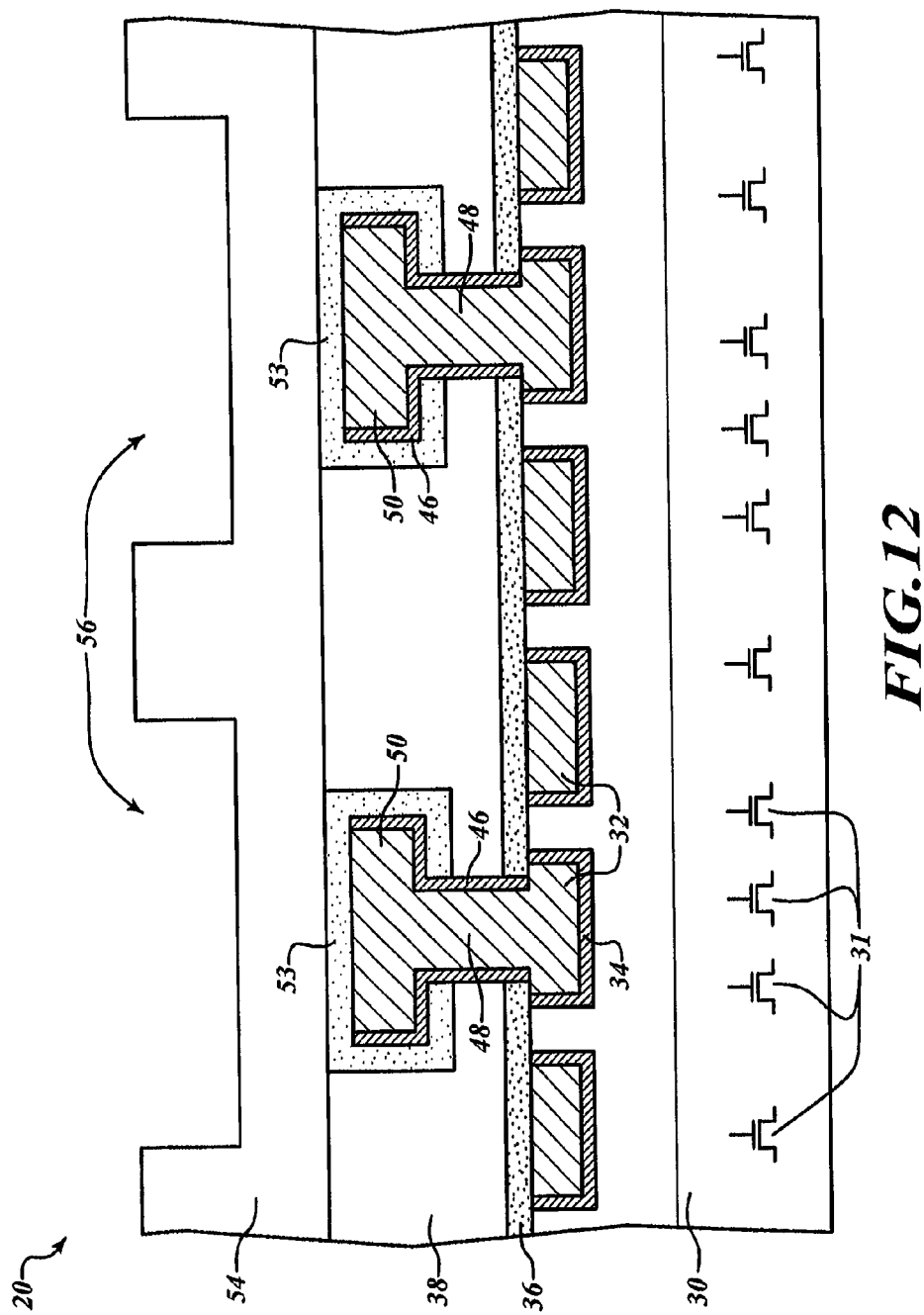
FIG. 12 is a cross section of an integrated circuit die having opening formed in the third dielectric layer.

In FIG. 12, the second intermetal dielectric layer 54 is patterned and etched to open wide trenches 56. The depth of the trenches is, for example, 500 Å. The trenches 56 are each placed over one of the second metal tracks 50. The trenches 56 each extend laterally beyond the edges of the respective second metal tracks 50. The trenches 56 can be opened using a reactive ion etch, wet etch, or any other suitable process such as those described previously.

Figure 13:
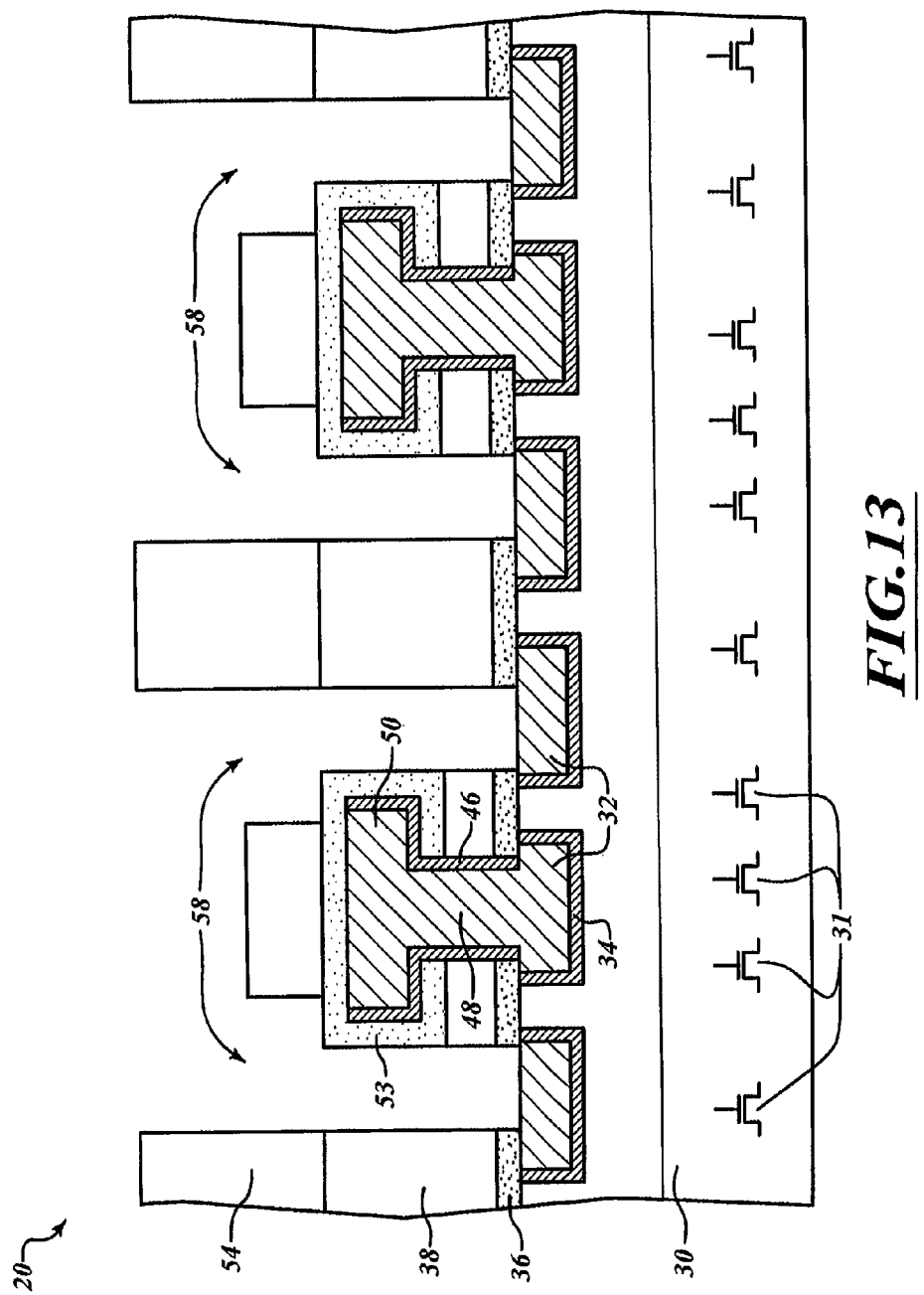
FIG. 13 is a cross section of an integrated circuit die having further openings in the third dielectric layer and the second dielectric layer.

In FIG. 13, the trenches 56 are further etched to open vias that contact the first metal lines 32 through the first and second intermetal dielectric layers 38, 54. Alignment of the vias 58 is easily accomplished because the dielectric encapsulation layer 53 surrounding the second metal tracks 50 acts as a mask or an etch stop for the etchant that etches the first and second intermetal dielectric layers 38, 54. Depending on the type of interconnecting vias to be formed, this can either eliminate the need for an extra mask or it can greatly reduce the alignment requirements because the vias 58 will be self-aligned with the dielectric encapsulation layer 53. For example, in one alternative embodiment, the same mask used to create the trenches 56 is used to etch through the dielectric layer 38 to reach first metal layer 32. The etch to form the trenches 56 continues to be carried out until the metal layer 32 is reached. In one embodiment the etch leaves a portion of the second intermetal dielectric layer 54 remains on the dielectric encapsulation layers 53. Alternatively, the second intermetal dielectric layer 54 can be entirely removed from the dielectric encapsulation layer 53.

Figure 14:
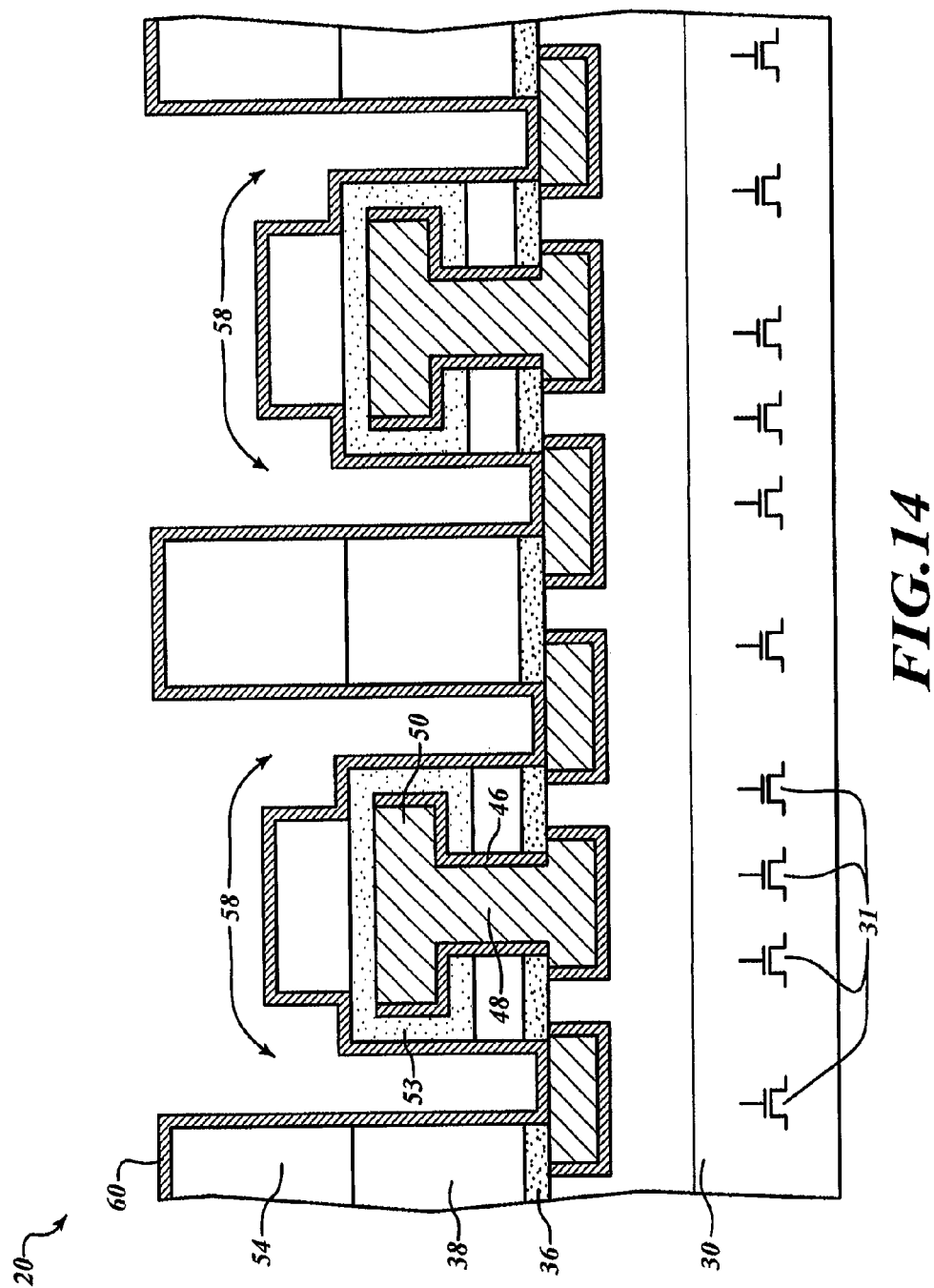
FIG. 14 is a cross section of an integrated circuit die having a metal barrier layer in the openings in the second and third dielectric layers.

In FIG. 14, a barrier layer 60 is deposited on the walls of the vias 58. The barrier layer 60 is thus in contact with the first and second intermetal dielectric layers. The barrier layer 60 is in contact with the exposed portions of the first metal tracks 32. The barrier layer 60, as described previously, can be titanium or a combination of titanium, titanium nitride, tantalum, and tantalum nitride or any other suitable materials for a barrier layer.

Figure 15:
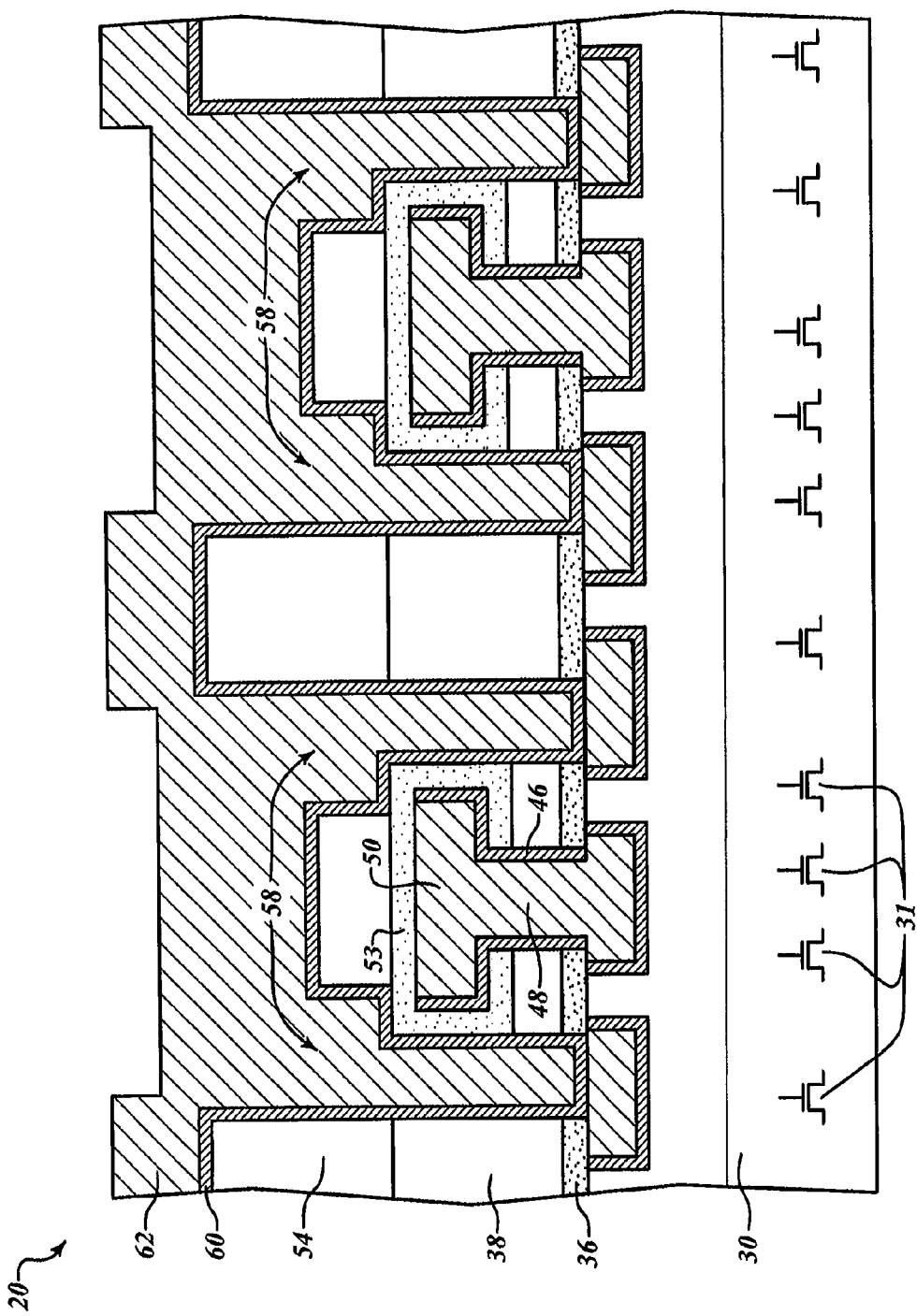
FIG. 15 is a cross section of an integrated circuit die having a third metal layer filling the openings in the second and third dielectric layers.

In FIG. 15, a conductive material 62 is deposited in the vias 58. The conductive material 62 is on the barrier layer 60 on the second intermetal dielectric layer 54. The conductive material 62 is placed in a very thick layer which exceeds the height of the second intermetal dielectric layer 54. The conductive material 62 is preferably copper. However, other suitable conductive materials can be used according to the dimensions of the integrated circuit and other considerations. In one embodiment, the conductive material 62 is the same material as the first metal tracks 32 and the second metal tracks 50.

Alternatively, the conductive material 62 can be a different material than the first metal tracks 32 and the second metal tracks 50. The conductive material 62 can be placed using an electroplating process or a combination of electrolysis and electroplating processes or in any other suitable manner.

Figure 16:
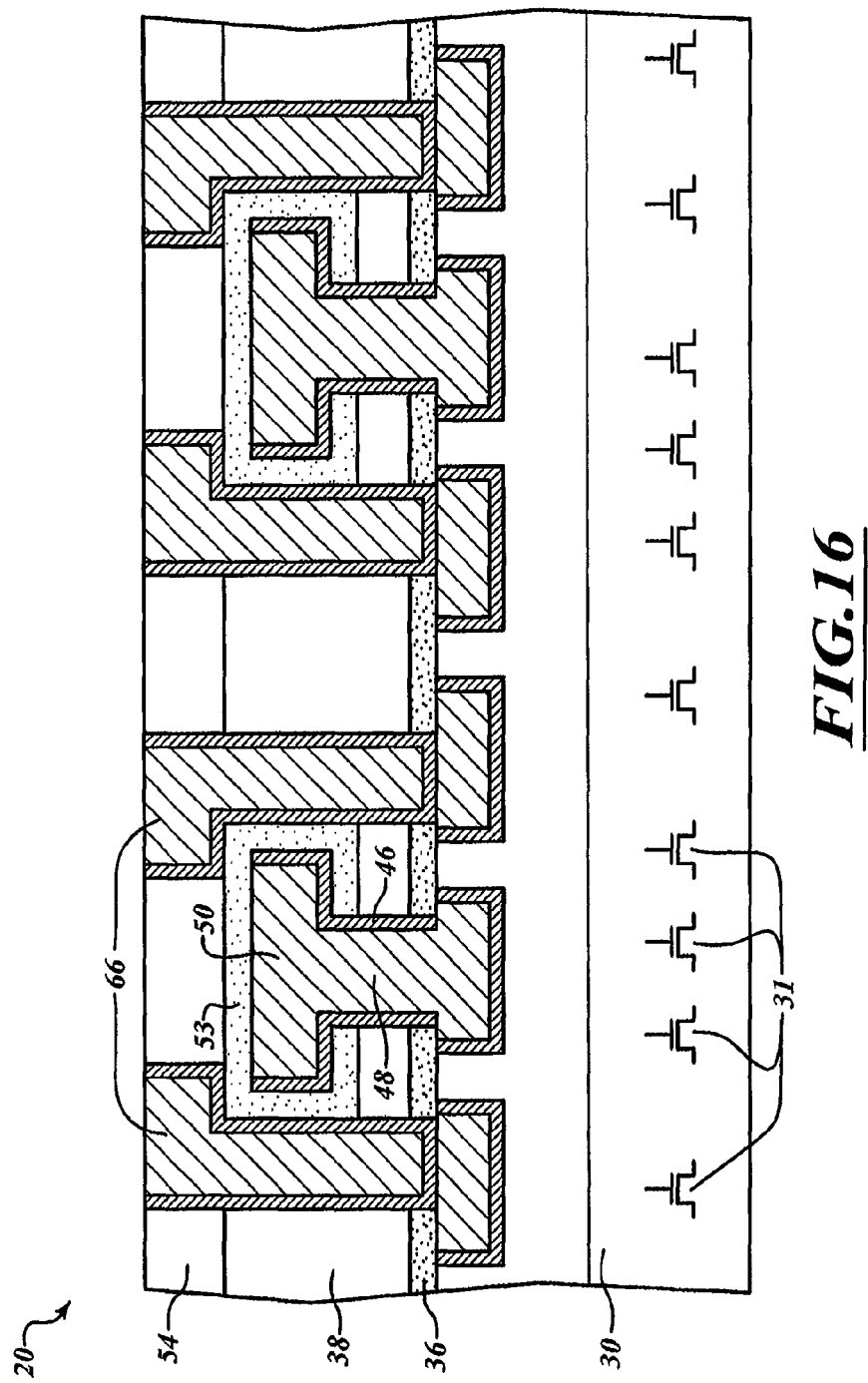
FIG. 16 is a cross section of an integrated circuit die having the third metal layer planarized to define third metal tracks.

In FIG. 16, a planarization process is performed as described previously. The planarization process removes excess portions of the conductive material 62, portions of the intermetal dielectric layer 54 and barrier layer 60. The chemical mechanical planarization process can be a timed process or can be configured to stop, for example, on the middle portion of the second intermetal dielectric layer 54 which rests on top of the second metal tracks 50. In this manner, distinct third metal tracks 66 are formed. The third metal tracks 66 are connected by vias to first metal tracks 32. Thus, a single process is used to fill the vias and form the third metal tracks 66. This allows relaxed photolithographic requirements, reduced photolithographic steps, a reduced number of metal deposition steps, improved protection against electromigration and time-dependent dielectric breakdown.

After the formation of the third metal tracks 66, the process described in relation to FIGS. 1-16 can be repeated to form more metal layers according to the number of metal layers to be used in the integrated circuit die 20.

Further dielectric layers can be formed over the third metal tracks 66 in accordance with known processes for forming integrated circuit dies. Eventually passivation layers can be formed over the third metal tracks 66, contact pads can be formed on the passivation layers to provide connections to the transistors 31 through the metal tracks and vias in the integrated circuit die 20. Finally, the integrated circuit can be encapsulated in a molding compound and provided with solder balls, leads, or pins coupled to the contact pads so that the integrated circuit die can be installed in an electronic component such as on a circuit board or other suitable location. Many processes and structures for forming an integrated circuit die have not been described in detail in this disclosure. Such other processes and structures are known to those of skill in the art or can be implemented in light of the present disclosure.

The process and structure described in relation to FIGS. 1-16 is given by way of example. Other types of materials, thickness, widths, structures and patterns can be used in accordance with principles of the present disclosure. All such alternative embodiments fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
   forming a first metal track overlying a semiconductor substrate;
   forming a first intermetal dielectric layer on the first metal track;
   forming a second metal track overlying the first intermetal dielectric layer;
   encapsulating the second metal track in a dielectric encapsulation layer;
   forming a second intermetal dielectric overlying the first intermetal dielectric, the first and second intermetal dielectric layers being selectively etchable with respect to the dielectric encapsulation layer; and
   etching a via through the first and second intermetal dielectric layers to the first metal track, the dielectric encapsulation layer forming at least one sidewall that determines one of width dimension of the via.

2. The method of claim 1 comprising forming a conductive plug in the via.

3. The method of claim 2 comprising forming a third metal track on the conductive plug.

4. The method of claim 3 wherein forming the conductive plug and the third metal track includes:
   depositing a conductive material in the via and on the second intermetal dielectric layer; and
   removing the conductive material from a top surface of the second intermetal dielectric layer.

5. The method of claim 3 wherein the conductive plug electrically connects one of the third metal tracks with one of the first metal tracks.

6. The method of claim 1 wherein the dielectric encapsulation layer includes silicon nitride.

7. The method of claim 6 wherein the dielectric encapsulation layer includes carbon.

8. The method of claim 1 wherein the first intermetal dielectric layer is a porous dielectric layer.

9. The method of claim 1 wherein the dielectric encapsulation layer is less than 50 nm thick.

10. A method comprising:
    forming a plurality of first metal tracks on a substrate;
    forming a first dielectric layer on the substrate and the first metal tracks;
    forming a second metal track on the first dielectric layer;
    covering a top and sides of the second metal track in a dielectric protection layer;
    forming a second dielectric layer on the first dielectric layer and on the dielectric protection layer, the first and second dielectric layers being selectively etchable with respect to the dielectric protection layer; and
    etching a first and a second via in the first and second dielectric layers on opposite sides of the second metal track to each contact respective first metal tracks, the dielectric protection layer defining respective widths of the first and second vias.

11. The method of claim 10 comprising:
    etching the second dielectric layer over the second metal track, a portion of the second dielectric layer remaining on the dielectric protection layer; and
    etching the first and second vias in the first and second dielectric layers, the dielectric protection layer acting as a mask to define the widths of the first and the second vias.

12. A method comprising:
forming a plurality of first metal tracks on a substrate;
forming a first dielectric layer on the substrate and the first metal tracks;
forming a second metal track on the first dielectric layer;
covering a top and sides of the second metal track in a dielectric protection layer;
forming a second dielectric layer on the first dielectric layer and on the dielectric protection layer, the first and second dielectric layers being selectively etchable with respect to the dielectric protection layer; and
etching first and second vias in each of the first and second dielectric layers on opposite sides of the second metal track to each contact respective first metal tracks, the dielectric protection layer defining respective widths of the first and second vias;
etching the second dielectric layer over the second metal track, a portion of the second dielectric layer remaining on the dielectric protection layer;
etching the first and second vias in the first and second dielectric layers, the dielectric protection layer acting as a mask to define the widths of the first and the second vias;
depositing a conductive material in the first and second vias and over the dielectric protection layer; and
removing the conductive material above the remaining portion of the second dielectric layer on the dielectric protection layer, the remaining portion of the second dielectric layer defining two third metal tracks each electrically coupled to the respective first metal tracks by the first and second vias.

13. A method comprising:
forming a plurality of first metal tracks on a substrate;
forming a first dielectric layer on the substrate and the first metal tracks;
forming a second metal track on the first dielectric layer;
covering a top and sides of the second metal track in a dielectric protection layer;
forming a second dielectric layer on the first dielectric layer and on the dielectric protection layer, the first and second dielectric layers being selectively etchable with respect to the dielectric protection layer; and
etching first and second vias in each of the first and second dielectric layers on opposite sides of the second metal track to each contact respective first metal tracks, the dielectric protection layer defining respective widths of the first and second vias;
etching the second dielectric layer over the second metal track, a portion of the second dielectric layer remaining on the dielectric protection layer;
etching the first and second vias in the first and second dielectric layers, the dielectric protection layer acting as a mask to define the widths of the first and the second vias;
depositing copper in the first and second vias and over the dielectric protection layer; and
removing the copper above the remaining portion of the second dielectric layer on the dielectric protection layer, the remaining portion of the second dielectric layer defining two third metal tracks each electrically coupled to the respective first metal tracks by the first and second vias.

* * * * *